United States Patent
Abdennadher et al.

(10) Patent No.: US 8,090,548 B2
(45) Date of Patent: Jan. 3, 2012

(54) METHOD AND DEVICE FOR PREDICTING ELECTROLYTIC CAPACITOR DEFECTS, CONVERTER AND UNINTERRUPTIBLE POWER SUPPLY EQUIPPED WITH SUCH A DEVICE

(75) Inventors: Karim Abdennadher, Gieres (FR); Christophe Rosset, Echirolles (FR); Gérard Rojat, Chaponost (FR); Pascal Venet, Saint Jean de Niost (FR)

(73) Assignee: MGE UPS Systems, Montbonnot-Saint-Martin (FR)

( * ) Notice: Subject to any disclaimer, the term of this patent is extended or adjusted under 35 U.S.C. 154(b) by 530 days.

(21) Appl. No.: 12/285,526

(22) Filed: Oct. 8, 2008

(65) Prior Publication Data
US 2009/0112493 A1 Apr. 30, 2009

(30) Foreign Application Priority Data
Oct. 30, 2007 (FR) ...................................... 07 07620

(51) Int. Cl.
*G01R 31/00* (2006.01)
(52) U.S. Cl. ........................... 702/58; 324/537; 324/548
(58) Field of Classification Search .................... 702/58; 324/537, 548
See application file for complete search history.

(56) References Cited

U.S. PATENT DOCUMENTS
2007/0103136 A1  5/2007  Jain ................................ 323/282

FOREIGN PATENT DOCUMENTS
WO   WO 01/11377   2/2001

OTHER PUBLICATIONS

A Real time predictive maintenance system of Aluminium Electrolytic Capacitor used in Uninterrupted Power Supplies, Industry Application Society Annual Meeting, Oct. 5, 2008. IAS 08. IEEE.*

* cited by examiner

*Primary Examiner* — Drew A Dunn
*Assistant Examiner* — Hien Vo
(74) *Attorney, Agent, or Firm* — Steptoe & Johnson LLP

(57) ABSTRACT

A method and device for predicting defects of a capacitor, the method including determining the ripple voltage (Udc), the temperature (TP), and the current (Ic) of the capacitor, determining the value of an equivalent series resistance (ESR) of the capacitor, and the capacitance value (C) of the capacitor using a digital filter, determining information representative of the state of aging of the capacitor according to the temperature of the capacitor, and displaying that information and information representative of the value of the capacitance (C) and/or information representative of a cause associated with the state of aging according to the capacitance value. The device may include a converter and an uninterruptible power supply.

14 Claims, 4 Drawing Sheets

METHOD AND DEVICE FOR PREDICTING ELECTROLYTIC CAPACITOR DEFECTS, CONVERTER AND UNINTERRUPTIBLE POWER SUPPLY EQUIPPED WITH SUCH A DEVICE

BACKGROUND OF THE INVENTION

The invention relates to a method for predicting defects of at least one electrolytic capacitor comprising:
measuring the ripple voltage between the contact terminals of the capacitor,
measuring the capacitor temperature,
determining (or measuring) the current flowing in the capacitor,
determining the value of an equivalent series resistance of the capacitor,
determining the value of a theoretical equivalent series resistance of said capacitor according to the temperature of the capacitor,
comparing the value of the equivalent series resistance of the capacitor with the theoretical series equivalent value of said capacitor, and
displaying at least one item of information representative of the state of ageing of the capacitor.

The invention also relates to a converter converting a variable voltage into DC voltage comprising at least one power supply line, at least one electrolytic capacitor connected to an output of said converter, and a device for predicting defects.

The invention further relates to an uninterruptible power supply comprising a converter converting a variable voltage into DC voltage and an inverter.

STATE OF THE ART

Electrolytic capacitors are generally used in electric power converters for filtering the input voltage or the output voltage. These converters can be designed for supply of DC voltage to electronic systems of equipment for which any shutdown may be prejudicial. It has been observed that most failures of these converters are due to malfunctioning of the electrolytic capacitors.

It is known to implement methods enabling the state of ageing of a capacitor to be determined. European Patent EP 1 198 715 describes one such method comprising:
measuring a ripple voltage between the contact terminals of the capacitor and a current flowing in the capacitor,
determining the value of an equivalent series resistance of the capacitor according to these measurements,
measuring the capacitor temperature,
determining a theoretical equivalent series resistance of said capacitor corresponding to a non-defective capacitor according to this capacitor temperature, and
comparing two equivalent series resistances to determine information representative of the state of ageing of the capacitor.

A technical problem of prior art methods is that they do not enable the cause of malfunctioning of the electrolytic capacitor to be determined.

SUMMARY OF THE INVENTION

The object of the invention is to remedy the technical problems of the prior art methods by proposing a method for predicting defects of at least one electrolytic capacitor comprising:
measuring the ripple voltage between the contact terminals of the capacitor,
measuring the capacitor temperature,
determining or measuring the current flowing in the capacitor,
determining the value of an equivalent series resistance of the capacitor,
determining at least one item of information representative of the state of ageing of the capacitor by means of a model for determining a theoretical equivalent series resistance of said capacitor according to the temperature of the capacitor, and
displaying the information representative of the state of ageing of the capacitor.

According to the present invention, the method comprises determination of the capacitance value of the capacitor, determinations of the equivalent series resistance and of the capacitance are performed by means of a digital filter, and the method comprises display of information representative of the capacitance value of the capacitor or/and of information representative of at least one cause associated with the state of ageing of said capacitor according to the capacitance value and/or the equivalent series resistance of the capacitor.

The digital filter is preferably a Kalman filter. For example, the Kalman filter implements a recursive type algorithm.

According to one embodiment, the method comprises application of a pseudo-random binary sequence to the terminals of the capacitor.

The invention also relates to a device for predicting defects of at least one electrolytic capacitor comprising:
means for measuring the ripple voltage between the contact terminals of the capacitor,
means for measuring the temperature of the capacitor,
means for determining or measuring the current flowing in the capacitor,
a processing unit comprising first processing means for determining the value of an equivalent series resistance of the capacitor, and second processing means for determining at least one item of information representative of the state of ageing of the capacitor from a model for determining a theoretical equivalent series resistance of said capacitor according to the temperature of the capacitor, and
an output interface connected to the processing unit and enabling the information representative of the state of ageing of the capacitor to be displayed.

In the device according to the invention, the first processing means are essentially formed by a digital filter for further determining the capacitance value of the capacitor, and the output interface further enables information representative of the capacitance value of the capacitor or/and information representative of at least one cause associated with the state of ageing of said capacitor according to the capacitance value and/or the equivalent series resistance of the capacitor to be displayed.

The processing unit preferably comprises means for identifying at least one cause associated with the state of ageing of said capacitor according to the capacitance value and/or the equivalent series resistance of said capacitor, and the output interface enables information representative of at least one cause of the state of ageing to be displayed.

The device preferably comprises an auxiliary processing unit comprising means for identifying at least one cause associated with the state of ageing of the capacitor designed to be connected to the output interface.

According to one embodiment, the first processing means comprise a Kalman filter to determine the values of the equivalent series resistance of the capacitor and of the capacitance of the capacitor. The Kalman filter preferably implements a recursive type algorithm.

According to one embodiment, the method comprises means for applying a pseudo-random binary sequence to the terminals of the capacitor.

The invention also relates to a converter converting a variable voltage into DC voltage, for example a power converter, comprising at least one power supply line, at least one electrolytic capacitor connected to an output of said converter, and a device for predicting defects, in which the device for predicting defects is as the one described above and enables defects of the electrolytic capacitor to be predicted.

The means for determining the current flowing in the capacitor are preferably connected to means for measuring a current on the power supply line and means for measuring a current in an electric load.

The converter preferably comprises a plurality of electrolytic capacitors connected in parallel, the prediction device enabling defects of said plurality of electrolytic capacitors to be predicted.

The invention also relates to an uninterruptible power supply comprising a converter converting a variable voltage into DC voltage and an inverter, wherein the converter is as the one described above, the inverter being connected to the output of said converter.

BRIEF DESCRIPTION OF THE DRAWINGS

Other advantages and features will become more clearly apparent from the following description of particular embodiments of the invention given for non-restrictive example purposes only and represented in the accompanying drawings.

DETAILED DESCRIPTION OF AN EMBODIMENT

Figure 1:
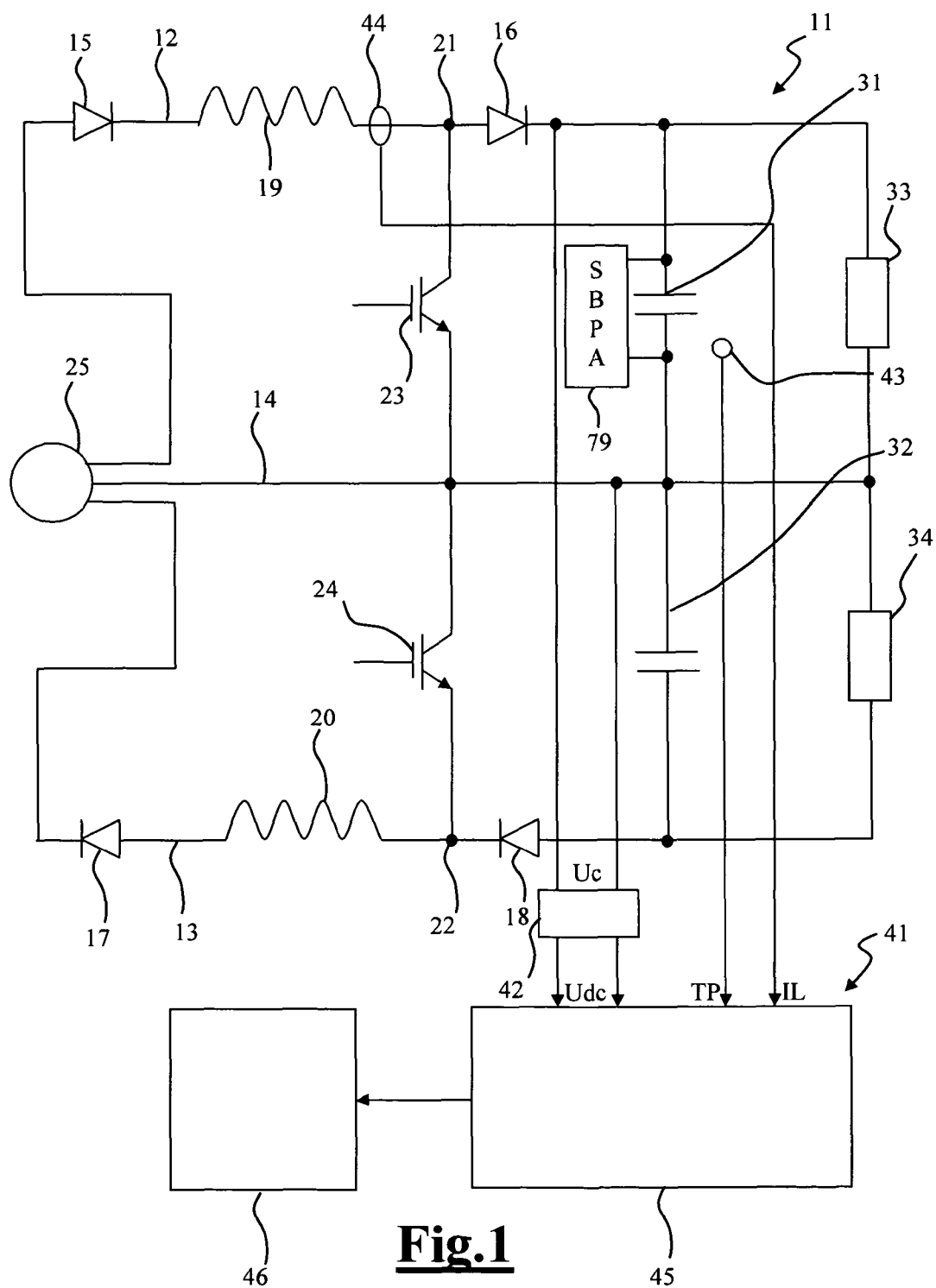
FIG. 1 schematically represents a power converter and a device for predicting defects of an electrolytic capacitor of said converter.

The device for predicting defects according to the invention can be applied to any converter, in particular a power converter, for example of the PFC type, i.e. a converter with power factor correction. A converter converting an AC voltage into DC voltage of this type is represented in FIG. 1. Converter 11 is supplied by a sinusoidal AC voltage source 25. Source 25 is connected by means of a positive bus 12 in which the current direction is imposed by means of a diode 15, a negative bus 13 in which the current direction is imposed by means of a diode 17, and a neutral conductor 14. Each bus comprises an inductance coil 19, 20 to store the input power when controlled switches 23, 24 are in the closed position and to restore this power to capacitors 31, 32 via freewheel diodes 16, 18, when controlled switches 23, 24 are in the open position. The controlled switches are fitted between one of the points of the circuit referenced 21, 22 and neutral conductor 14. When a controlled switch is in the closed position, an electric contact is thereby established between one of the points 21, 22 and neutral conductor 14. Likewise, when this controlled switch is in the open position, this electric contact is not established. Controlled switches 23, 24 are controlled by control means which are not represented. Controlled switches 23, 24 can be transistors, for example of IGBT, field-effect or other types. Load 33, 34 is therefore supplied by the variable voltage thus obtained.

The reference electric potential of the neutral conductor is imposed by the neutral reference of power supply 25. These capacitors are generally of electrolytic type and are often the cause of power converter malfunctions. Any defect of capacitors 31, 32 may lead to unscheduled shutdowns or to damage to the power converter, and therefore to loss of production. Often, on installations called sensitive installations, these capacitors are fitted in redundancy.

To remedy these shortcomings, the converter represented in FIG. 1 comprises a device 41 for predicting defects. To simplify FIG. 1, the device for predicting defects represented is applied to capacitor 31 only. An identical device could be applied to capacitor 32.

The prediction device 41 represented in FIG. 1 comprises measuring means such as:
 means 42 for measuring the ripple voltage Udc between the contact terminals of the capacitor 31,
 means 43 for measuring the temperature TP of the capacitor, and
 means 44 for measuring the current IL flowing in the positive bus.

As represented in FIG. 1, prediction device 41 further comprises a processing unit 45 and an output interface 46 connected to the processing unit for indicating at least one item of information representative of the state of ageing of the capacitor. Processing unit 45 and output interface 46 are represented in more detailed manner in FIG. 2. The measuring means described above are connected to an analog-to-digital converter 47 of processing unit 45.

The system for measuring the ripple voltage Udc generally comprises a high-pass filter, not represented, for example with a cutoff frequency of 200 Hz. This filter can be used to eliminate the DC component of the voltage between the terminals of the capacitor. Once this component has been eliminated, the measuring system can be adjusted to have positive voltage values of less than 3V on input to the processing unit, for example by means of electronic circuits with operational amplifiers.

Figure 2:
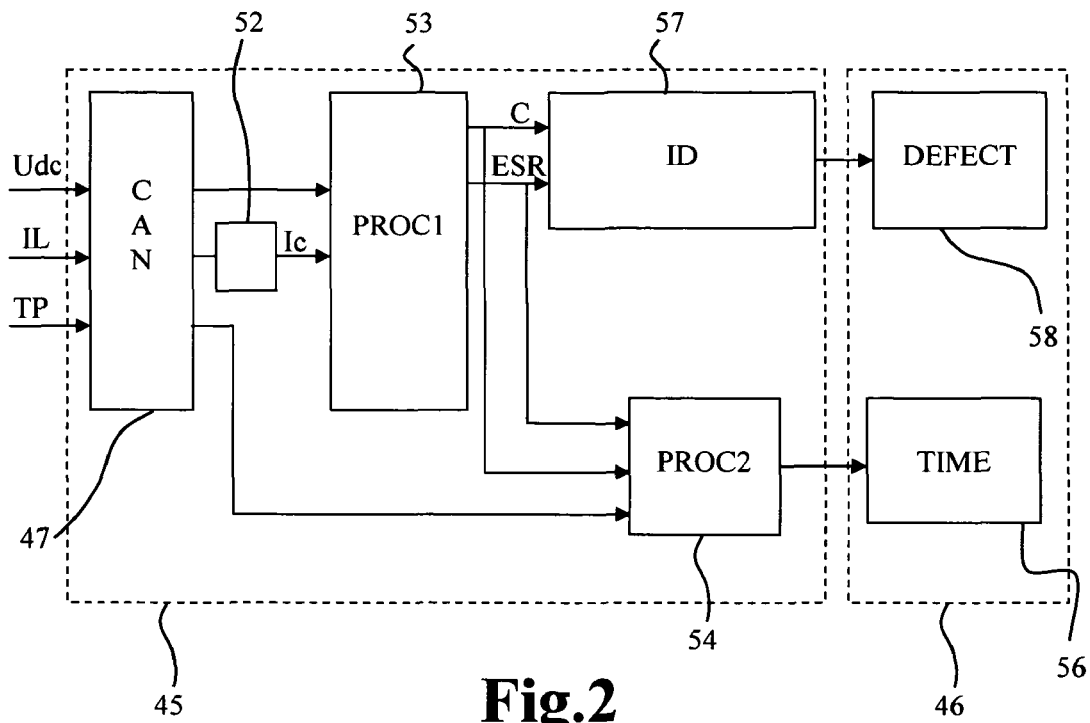
FIG. 2 schematically represents a processing unit and an output interface of a device for predicting defects of an electrolytic capacitor.

In the embodiment represented in FIG. 2, the value of the current Ic flowing in the capacitor is determined, by means of a module 52, from measurement of the current IL flowing in the positive bus. The current Ic flowing in the capacitor can be determined by making the difference between the current Id flowing in diode 16 and the current Ich flowing in load 33. The current Id flowing in diode 16 is generally dependent on the current IL flowing in the positive bus and on the state of controlled switch 23. The value of the current Ic in load 33 for its part depends on the type of load. In the case of a known load, for example a resistive load, the value of the current Ic in the load can be considered as being equal to the mean of the current Id flowing in diode 16. In the case of a load corresponding to an inverter, i.e. in the case of a complete converter comprising a converter of PFC type, as represented in FIG. 1, and an inverter, the value of the current Ic in load 33 can be considered as being equal to the product of the inverter output voltage and of the inverter output current divided by the product of the voltage Uc between the contact terminals of the capacitor and of the global efficiency of the inverter. It is thereby possible, by means of module 52, to determine the value of the current Ic in the capacitor among other things from the value of the current IL flowing in the positive bus. In other embodiments that are not represented, it is also possible to measure the value of the current Ic in the capacitor directly.

Figure 3A:
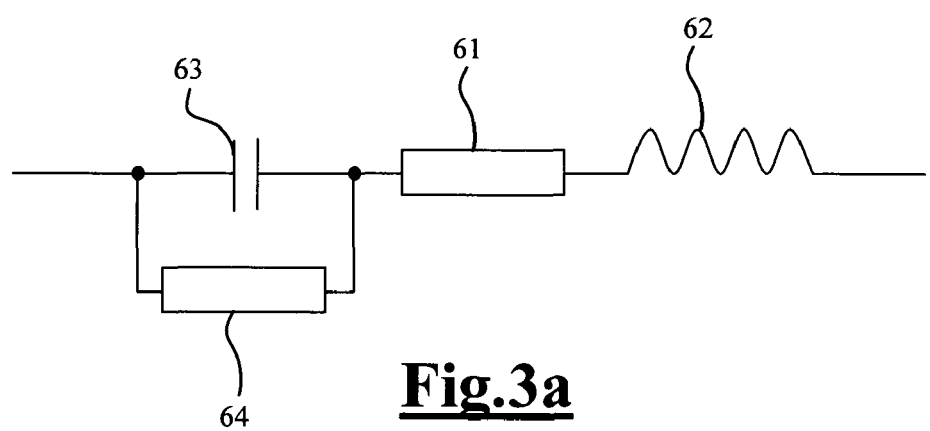
FIGS. 3a and 3b respectively represent an electrolytic capacitor model and the associated equivalent model.

Processing unit 45 comprises first processing means 53 for determining the values of an equivalent series resistance and of the capacitance of the capacitor. The model represented in FIG. 3a is used to determine the equivalent series resistance of the capacitor. This model comprises a certain number of parameters, such as a first resistance 61 connected in series with an inductance coil 62 and a purely capacitive ideal capacitor 63. In this model, a leakage resistor 64 is connected in parallel with the ideal capacitor 63.

Figure 3B:
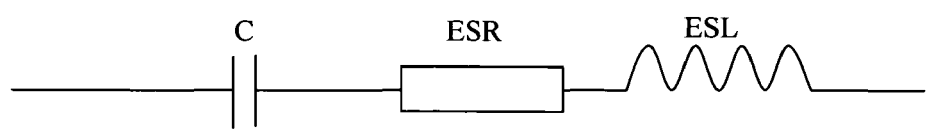

The value of the equivalent resistance is therefore determined by means of the equivalent model represented in FIG. 3b according to the parameters of the model of FIG. 3a.

According to one feature of the invention, first processing means 53 further enable the capacitance value of the capacitor to be determined. Not only the value of the equivalent resistance, but also the value of the capacitance C of the capacitor, can thereby be determined by means of the equivalent model of the FIG. 3b. These two quantities, as well as the equivalent inductance ESL, depend on the frequency and temperature of the capacitor. For frequencies lower than a resonance frequency, the equivalent inductance becomes negligible and the equivalent model comprises only the equivalent series resistance ESR in series with the capacitor of capacitance C. In this case, the transfer function linking the current Ic in the capacitor to the ripple voltage Udc between the contact terminals of the capacitor is a first-order function comprising the equivalent series resistance ESR and the capacitance C as parameters.

Figure 4:
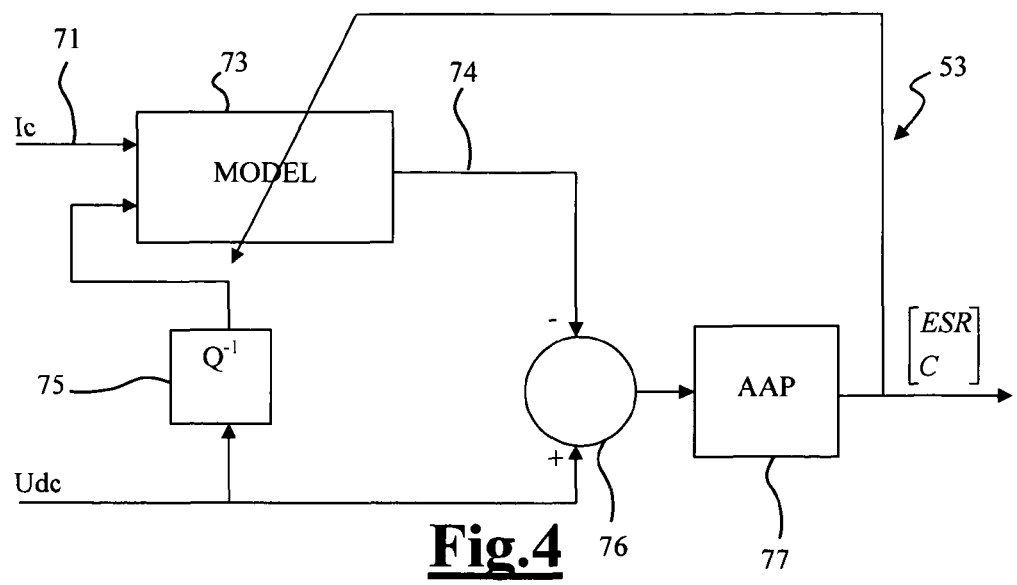
FIG. 4 schematically represents the first processing means of the processing unit for determining the value of an equivalent series resistance and the capacitance value of the capacitor.

According to another feature of the invention, first processing means 53 are essentially formed by a digital filter determining the values of the equivalent series resistance and of the capacitance of the capacitor. As represented in FIG. 4, the digital filter of first processing means 53 is a Kalman filter, in this instance a Kalman filter implementing a recursive type algorithm, for example of recursive least square type. The parameters of the function linking the current Ic in the capacitor to the ripple voltage Udc between the contact terminals of the capacitor, i.e. the equivalent series resistance ESR and the capacitance C, can therefore be determined by means of the Kalman filter.

The digital filter of first processing means 53 represented in FIG. 4 comprises a first input 71 of the current Ic to capacitor and a second input 72 of the ripple voltage Udc between the contact terminals of the capacitor. The filter also comprises a module 73 of the transfer function linking the current Ic to the voltage Udc. This module 73 enables a first value 74 of the ripple voltage Udc at the terminals of the capacitor to be estimated in real time, or more precisely at a given time step. This first value 74 of the voltage Udc is estimated according to the current Ic in the capacitor at this same time step and to the ripple voltage Udc at a previous time step. The ripple voltage Udc at a previous time step is for its part determined by means of a lag function 75. During this same time step, this first value 74 of the voltage Udc is compared with measurement of this same voltage Udc by means of a comparator 76. A parameter matching algorithm 77 is used to re-evaluate the transfer function parameters, i.e. the equivalent series resistance ESR and capacitance C, according to the difference between the first value 74 of the voltage Udc and measurement of this voltage. The parameters re-evaluated in this way are then re-input to transfer function module 73.

In order to determine the equivalent series resistance ESR and the capacitance C with greater precision, it is preferable to apply a pseudo-random binary sequence 79, as represented in FIG. 1, to the terminals of the capacitor. This pseudo-random binary sequence can be a superposition signal presenting a broad frequency spectrum, in particular a frequency spectrum containing at least the spectrum of useful frequencies of the capacitor, i.e. a frequency spectrum covering the passband of the capacitance C and of the equivalent series resistance ESR of the capacitor.

As represented in FIG. 2, processing unit 45 comprises second processing means 54 for determining at least one item of information representative of the state of ageing of the capacitor from a model determining a theoretical equivalent series resistance or/and the theoretical capacitance of said capacitor according to the temperature of the capacitor. This information representative of the state of ageing generally corresponds to a mean time before failure. This information is determined from measurement of the capacitor temperature TP, and of the values of the equivalent resistance ESR and of the capacitance C, determined in real time. The second processing means 54 are represented in more detailed manner in FIG. 5.

To determine information representative of the state of ageing of the capacitor, ageing models enabling the equivalent series resistance ESR and capacitance C of the capacitor to be determined as a function of time are implemented. The equivalent series resistance ESR and capacitance C can be determined from these ageing models by defining predetermined malfunction conditions and using the equivalent series resistance ESR and capacitance C of the capacitors as indicators. For example, the malfunction condition using the equivalent series resistance ESR as indicator can correspond to a 100% increase of the value of this equivalent resistance, i.e. the capacitor is considered as being potentially defective if, when the latter is in operation, the value of the equivalent series resistance of this capacitor reaches twice the initial value. In the same way, the malfunction condition using the capacitance C of the capacitor as indicator can correspond to a decrease, for example a 20% decrease, of the initial capacitance value.

The ageing models are used in conjunction with models for determining a theoretical equivalent series resistance ESRt and a theoretical capacitance Ct of the capacitor according to the temperature TP of said capacitor. The theoretical equivalent series resistance ESRt and theoretical capacitance Ct correspond to the values obtained by a sound or non-defective capacitor.

The different ageing modes and also the models for determining the theoretical equivalent series resistance and the theoretical capacitance comprise parameters that can be predetermined by ageing tests. Ageing tests can therefore be carried out previously, for different ageing temperatures TPV, on the type of electrolytic capacitor to be monitored. These tests enable the following parameters to be previously determined:

ageing times TIVESR, TIVC to meet defectiveness conditions respectively using the equivalent series resistance ESR and capacitance C of the capacitor as indicators, activation energy EAESR, EAC respectively associated with the equivalent series resistance ESR and capacitance C of the capacitor, coefficients ALP, BET, GAM of the model for determining the theoretical equivalent series resistance according to the temperature of the capacitor, coefficients XET, LAM, MU of the model for determining the theoretical capacitance according to the temperature of the capacitor, coefficients A1, B1 of the ageing model to determine the resistance equivalent series resistance as a function of time, and coefficients E, F of the ageing model to determine the capacitance as a function of time.

The models for determining the theoretical equivalent series resistance and the theoretical capacitance according to the capacitor temperature can be represented, for example purposes, by the following equations:

$$ESRt(TP) = ALP + BET * \exp(-TP/GAM)$$

$$CT(TP) = XET + LAM * TP$$

From the predetermined values of the ageing times TIVESR, TIVC for a given ageing temperature TPV, an ageing time TIESR', TIC' can be determined taking either the equivalent series resistance ESR or the capacitance C of the capacitor as indicator, for any operating temperature TP. For this, Arrhenius models are generally used. For example, with K being the Boltzmann's constant, the following equations can be used:

$$\frac{TIESR'}{TIVESR} = \exp\left[\frac{EAESR * (TPV - TP)}{K * TPV * TP}\right]$$

$$\frac{TIC'}{TIVC} = \exp\left[\frac{EAC * (TPV - TP)}{K * TPV * TP}\right]$$

Figure 5:
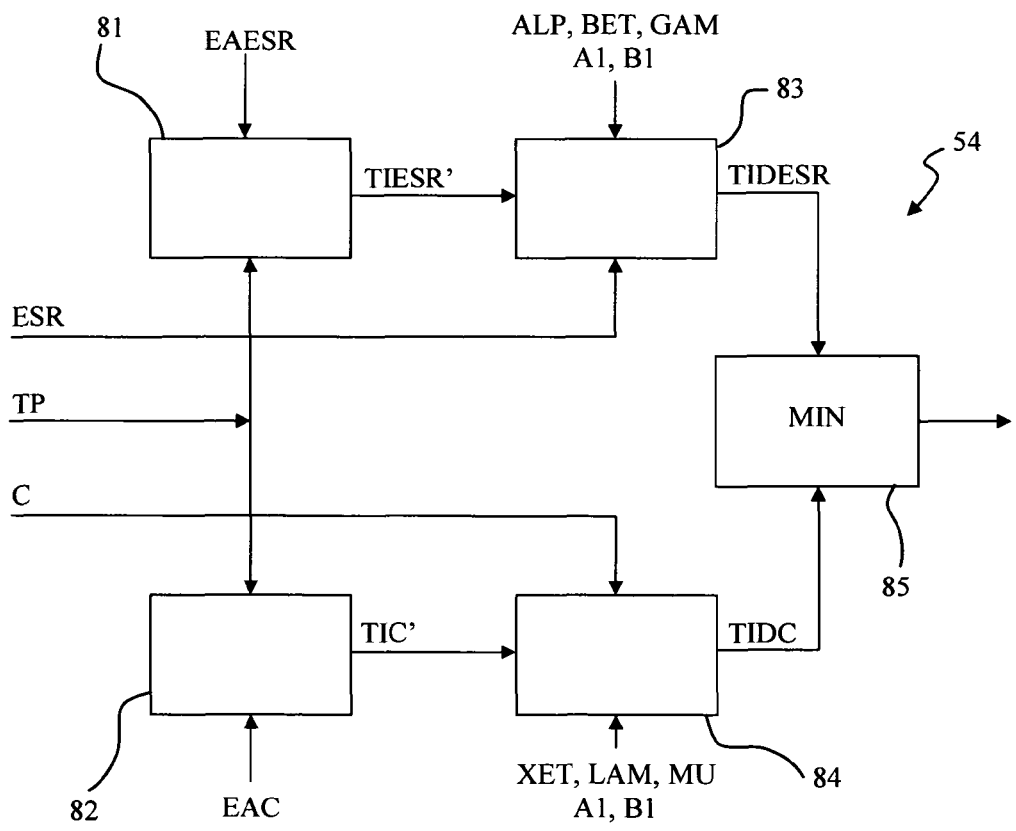
FIG. 5 schematically represents the second processing means of the processing unit for determining at least one item of information representative of the state of ageing of the capacitor.

As represented in FIG. 5, the ageing times TIESR', TIC' are determined by two modules 81, 82 of second processing means 54 according to the operating temperature TP of the capacitor.

The ageing model used to determine the equivalent series resistance ESR of the capacitor versus time generally presents an exponential time function. The ageing model used to determine the capacitance C of the capacitor versus time generally presents a linear time function. For example purposes, these models can be represented by the following equations:

$$ESR(TIESR) = ESR(0) * (1 - A1 + A1 * \exp(B1 * TI))$$

$$C(TIC) = C(0) - E * TIC$$

The values of ESR(0) and C(0) correspond respectively to the theoretical equivalent series resistance and to the theoretical capacitance, i.e. values corresponding to a sound and defect-free capacitor. These values are determined by means of the models for determining the theoretical equivalent series resistance and the theoretical capacitance according to the temperature of the capacitor, for a temperature equal to that of the operating temperature TP of the capacitor.

From the ageing models and the values of the equivalent series resistance ESR or of the capacitance C, a theoretical time TIESR, TIC can be determined corresponding to an ageing time of the capacitor taking either the equivalent series resistance ESR or the capacitance C as indicator.

As represented in FIG. 5, the second processing means of the processing unit comprise two modules 83, 84 for determining an ageing time TIDESR, TIDC corresponding to the remaining operating time before failure taking either the equivalent series resistance ESR or the capacitance C as indicator. This time is determined by subtracting the theoretical times TIESR, TIC respectively from the ageing times TIESR', TIC'. A comparison module 85 enables the ageing time TID to be determined by selecting the smallest value between two ageing times TIDESR, TIDC determined with the equivalent series resistance ESR and capacitance C as indicators.

As represented in FIG. 2, the prediction device comprises an output interface 46 connected to processing unit 45 and indicating information representative of the state of ageing of the capacitor. The ageing time TID is displayed by interface module 56.

According to another feature of the invention, output interface 46 further enables information representative of the capacitance value of the capacitor or/and information representative of at least one cause associated with the state of ageing of said capacitor according to the capacitance value of the capacitor to be displayed.

In the prediction device represented in FIG. 2, processing unit 45 comprises means 57 for identifying at least at least one cause associated with the state of ageing of said capacitor according to the capacitance value of said capacitor. Means 57 for identifying enable a malfunction mode, which may itself be associated with a malfunction cause, to be associated with variations of the capacitance C and/or of the equivalent series resistance ESR.

For example purposes, a 10% increase of the capacitance C in less than one second can be associated with a malfunction mode of "short-circuit" type. The causes of malfunctioning associated with this malfunction mode may be defects in the manufacturing process, such as a short-circuit between the capacitor electrodes, an insulation fault in the capacitor dielectric for example, and/or an insulation fault in the separating papers. The causes of malfunctioning associated with this malfunction mode can also be operating faults such as excessive charging and discharging cycles that may cause damage to the capacitor oxide layer.

For example, a 100% increase of the equivalent series resistance ESR in less than one second combined with stagnation of the capacitance C at a substantially constant value can be associated with a malfunction mode of "open circuit" type. The causes of malfunctioning associated with this malfunction mode may be manufacturing defects such as a mechanical stress and/or poor connection of the capacitor terminal connecting strips for example. The causes of malfunctioning associated with this malfunction mode may also be operating faults such as the presence of excessive charging or discharging currents.

For example, a 10% increase of the equivalent series resistance ESR with a period of ten thousand hours to several tens of thousands of hours combined with a 20% decrease of the capacitance C over this same period can be associated with a malfunction mode of "premature ageing" type. The causes of malfunctioning associated with this malfunction mode may be manufacturing defects such as the presence of a porous seal impairing tightness for example. The causes of malfunctioning associated with this malfunction mode may also be operating faults such as excessive current ripple causing a large thermal stress, the presence of overvoltage, the presence of a reverse voltage. The causes of malfunctioning associated with this malfunction mode may also be normal ageing faults.

In the embodiment represented in FIG. 2, the output interface enables information representative of the state of ageing by interface module 56, and information representative of the cause of the state of ageing by interface module 58 to be displayed.

Figure 6:
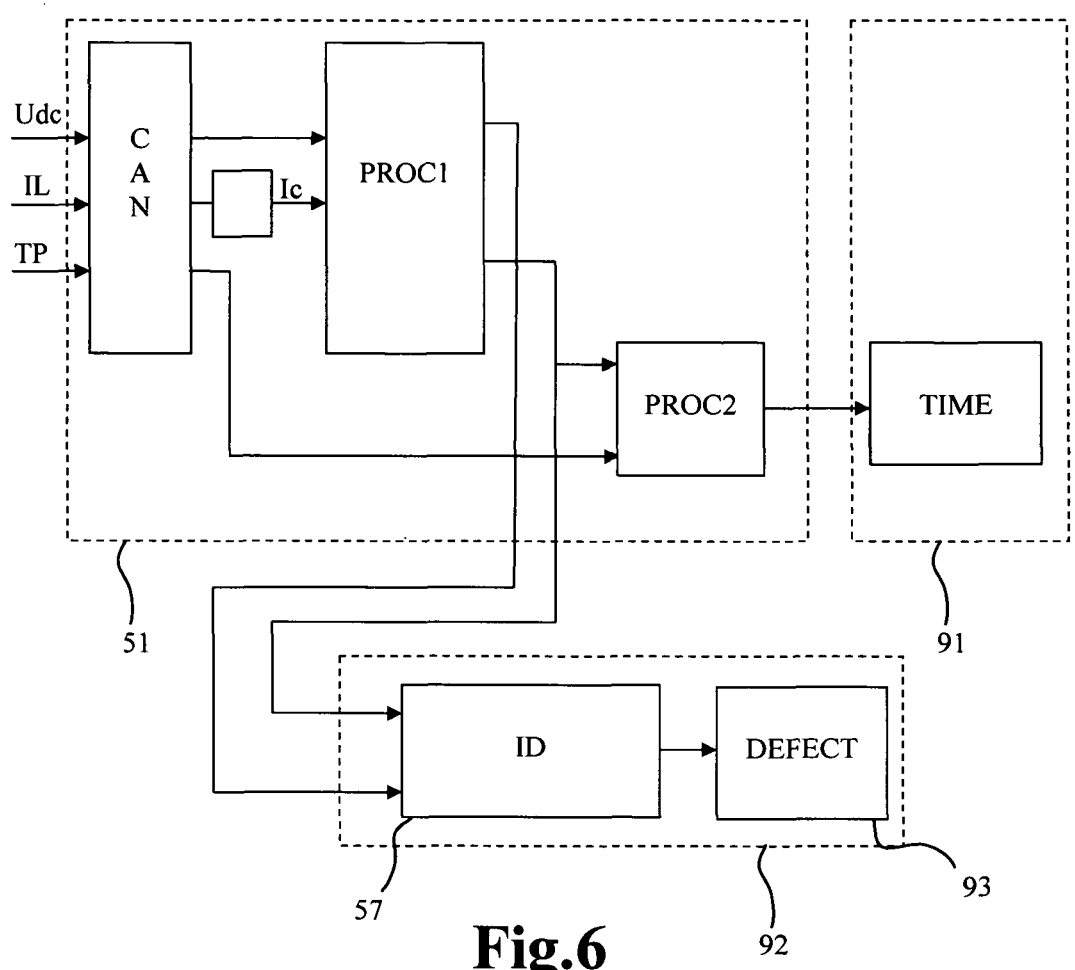
FIG. 6 schematically represents the processing unit and an output interface of a device for predicting defects of an electrolytic capacitor according to another embodiment.

In the embodiment represented in FIG. 6, output interface 91 only enables information representative of the state of ageing to be displayed. Unlike FIG. 2, processing unit 51 no longer comprises means for identifying at least one cause associated with the state of ageing of the capacitor. The device comprises an auxiliary processing unit 92 to which means 57 for identifying at least one cause associated with the state of ageing of the capacitor have been transferred. This auxiliary processing unit is designed to be connected to interface 91. An interface module 93 in auxiliary processing unit 92 enables the cause of malfunctioning to be displayed.

The converter equipped with such a device for predicting defects of an electrolytic capacitor can, in the case of a plurality of parallel-connected capacitors, enable defects of said plurality of capacitors to be predicted. In this case, an equivalent series resistance is determined such as to be equal to the ratio of the equivalent series resistance of a capacitor over the number of parallel-connected capacitors. An equivalent capacitance is also determined that is for its part equal to the product of the capacitance of a capacitor multiplied by the number of parallel-connected capacitors.

The invention claimed is:

1. A method for predicting defects in at least one electrolytic capacitor, the method comprising:
   measuring a ripple voltage between contact terminals of a capacitor,
   measuring a temperature of said capacitor,
   determining a value of a current flowing in the capacitor,
   determining by a digital filter a value of an equivalent series resistance of the capacitor, and the capacitance value of the capacitor,
   determining at least one item of information representative of the state of aging of the capacitor using a model for determining a theoretical equivalent series resistance of said capacitor according to the temperature of the capacitor, and
   displaying information representative of a state of aging of the capacitor by displaying information representative of the capacitance of the capacitor, and/or of information representative of at least one cause associated with the state of aging of said capacitor, according to the value of the capacitance and/or of the equivalent series resistance of the capacitor.

2. The method according to claim 1, wherein the digital filter is a Kalman filter.

3. The method according to claim 2, wherein the Kalman filter implements a recursive type algorithm.

4. The method according to claim 1, further comprising applying a pseudo-random binary sequence to the terminals of the capacitor.

5. A device for predicting defects in at least one electrolytic capacitor comprising:
   means for measuring a ripple voltage between contact terminals of a capacitor,
   means for measuring the temperature of a capacitor,
   means for determining a value of a current flowing in a capacitor,
   a processing unit comprising first processing means for determining a value of an equivalent series resistance of a capacitor, and second processing means for determining at least one item of information representative of a state of aging of a capacitor from a model for determining a theoretical equivalent series resistance of said capacitor according to the capacitor temperature,
   an output interface, connected to the processing unit, for enabling the information representative of the state of aging of a capacitor to be displayed,
   wherein the first processing means comprises a digital filter for determining the capacitance value of a capacitor, and the output interface is for enabling information representative of the capacitance of the capacitor and/or information representative of at least one cause associated with the state of aging of said capacitor according to the value of the capacitance and/or the equivalent series resistance value of the capacitor to be displayed.

6. The device according to claim 5, wherein the processing unit further comprises means for identifying at least one cause associated with the state of aging of a capacitor according to the value of the capacitance and/or of the equivalent series resistance of said capacitor, wherein the output interface is for displaying information representative of at least one cause of the state of aging.

7. The device according to claim 5, further comprising an auxiliary processing unit comprising means connected to the output interface for identifying at least one cause associated with the state of aging of the capacitor.

8. The device according to claim 5, wherein the first processing means comprises a Kalman filter for determining the values of the equivalent series resistance of the capacitor and of the capacitance of the capacitor.

9. The device according to claim 8, wherein the Kalman filter is for implementing a recursive type algorithm.

10. The device according to claim 5, further comprising means for applying a pseudo-random binary sequence to the capacitor terminals.

11. A converter for converting a variable voltage into DC voltage comprising a device according to claim 5, with at least one power supply line, and at least one electrolytic capacitor connected to an output of said converter.

12. The converter according to claim 11, wherein the means for determining a value of a current flowing in the capacitor is connected to means for measuring a current in the power supply line and to means for measuring a current in an electric load.

13. The converter according to claim 11, further comprising a plurality of parallel-connected electrolytic capacitors, the prediction device enabling defects of said plurality of electrolytic capacitors to be predicted.

14. An uninterruptible power supply comprising a converter according to claim 11, and an inverter connected to the output of said converter.

* * * * *